(12) United States Patent
Jeong

(10) Patent No.: US 9,070,304 B2
(45) Date of Patent: Jun. 30, 2015

(54) DEBRIS-FLOW SIMULATION APPARATUS HAVING VARIABLE FLUME

(75) Inventor: Sueng Won Jeong, Busan (KR)

(73) Assignee: Korea Institute of Geoscience and Mineral Resources, Daejeon (KR)

( * ) Notice: Subject to any disclaimer, the term of this patent is extended or adjusted under 35 U.S.C. 154(b) by 432 days.

(21) Appl. No.: 13/618,137

(22) Filed: Sep. 14, 2012

(65) Prior Publication Data

US 2013/0255406 A1    Oct. 3, 2013

(30) Foreign Application Priority Data

Mar. 28, 2012 (KR) .................. 10-2012-0031438
Mar. 28, 2012 (KR) .................. 10-2012-0031442

(51) Int. Cl.
*G09B 25/00* (2006.01)
*G09B 23/12* (2006.01)
*G06F 17/50* (2006.01)

(52) U.S. Cl.
CPC ............... *G09B 25/00* (2013.01); *G09B 23/12* (2013.01); *G06F 17/5009* (2013.01)

(58) Field of Classification Search
CPC ........ G09B 23/12; G09B 25/00; G09B 25/06; G09B 23/00; G09B 23/08; G09B 23/06; G09B 23/40; G09B 25/08; G06F 17/5009; A63G 21/18; A63G 31/007; E03F 3/046; E02B 13/00; E02B 5/00; E01C 11/227; B65G 11/146; B65G 21/12; B65G 21/14; B65G 2812/082

USPC .......... 141/11–12, 69, 71, 391; 56/13.3, 16.6, 56/194; 460/23, 114, 115; 73/865.6, 863

See application file for complete search history.

(56) References Cited

U.S. PATENT DOCUMENTS

| | | | | |
|---|---|---|---|---|
| 1,724,548 A | * | 8/1929 | Barcus | 193/6 |
| 2,277,701 A | * | 3/1942 | Houston | 405/119 |
| 3,446,025 A | * | 5/1969 | Koch | 405/43 |
| 4,198,043 A | * | 4/1980 | Timbes et al. | 472/117 |
| 5,653,592 A | * | 8/1997 | Davinroy | 434/126 |
| 2008/0095582 A1 | * | 4/2008 | Aristeo | 405/119 |
| 2008/0256704 A1 | * | 10/2008 | Conway | 5/412 |
| 2011/0028227 A1 | * | 2/2011 | Dubois et al. | 472/117 |
| 2012/0258812 A1 | * | 10/2012 | Osterman et al. | 472/117 |

FOREIGN PATENT DOCUMENTS

| KR | 100878139 B1 | 1/2009 |
|---|---|---|
| KR | 1020070117042 A | 3/2009 |

* cited by examiner

*Primary Examiner* — Daniel S Larkin
*Assistant Examiner* — Jamar Ray
(74) *Attorney, Agent, or Firm* — Fredrikson & Byron, P.A.

(57) ABSTRACT

Disclosed herein is a debris-flow simulation apparatus having a variable flume. The flume includes a plurality of flume bodies which are connected to each other in the longitudinal direction. The heights of the flume bodies can be easily adjusted, thus varying the angles of inclination of the flume bodies.

8 Claims, 13 Drawing Sheets

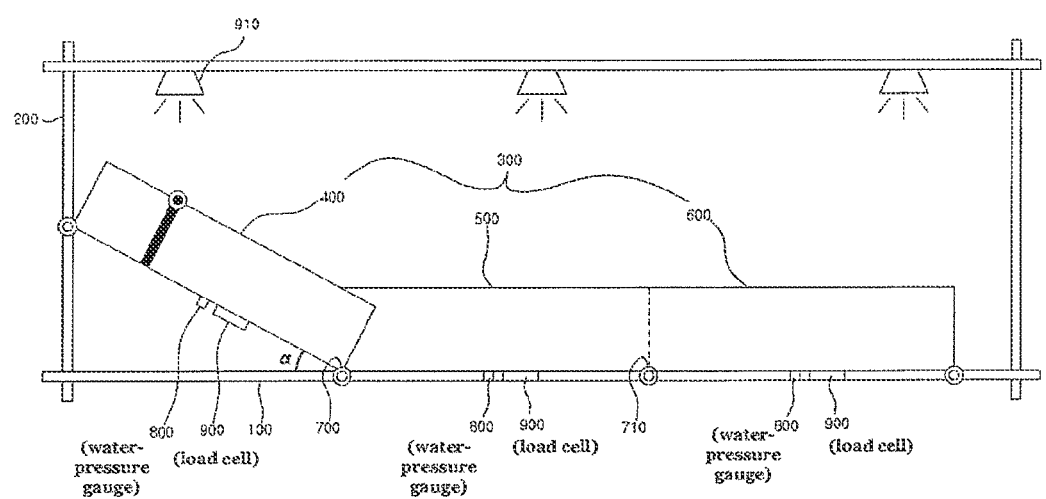
NEW FIG. 2.

Fig. 4
(a) 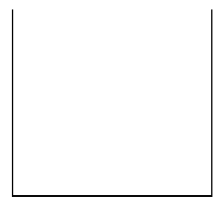
(b) 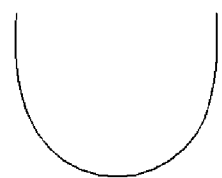
(c) 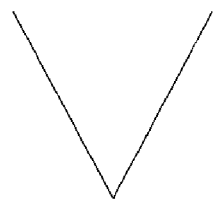
(d) 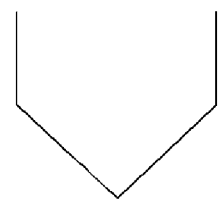
(e) 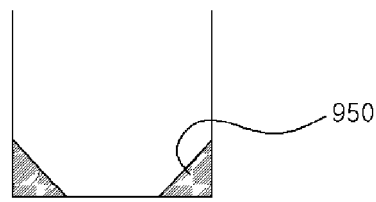

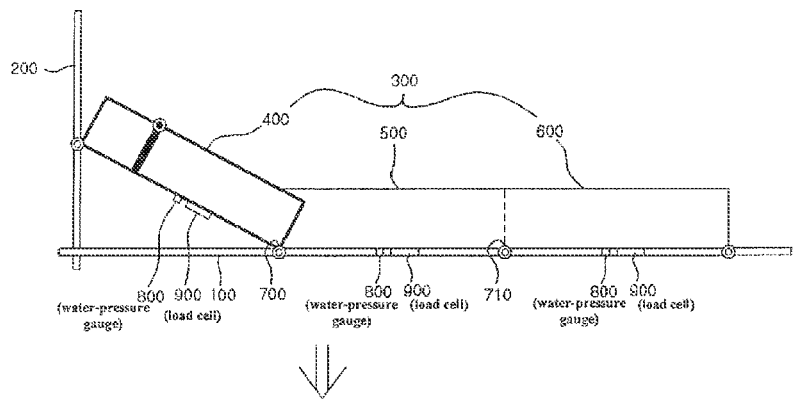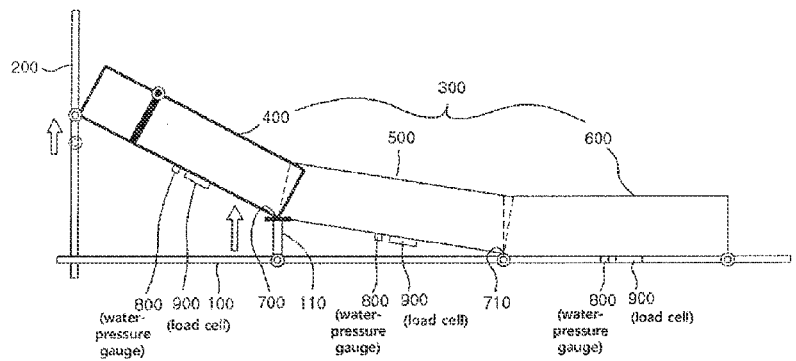
NEW FIG. 5.

Fig. 7
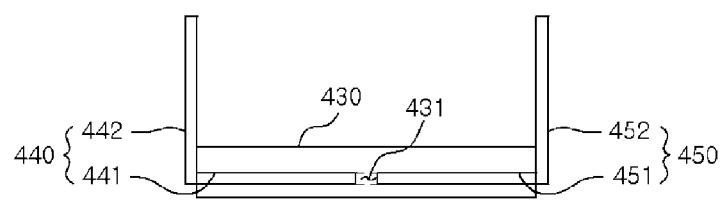
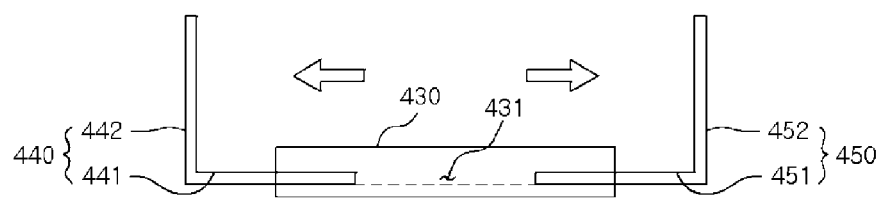
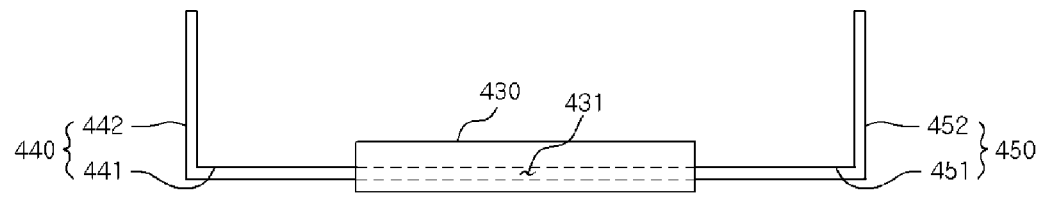

Fig. 8
(a)
1 : 1 : 1
(b)
1 : 2 : 3
(c)
1 : 2 : 5

Fig. 12
(a)
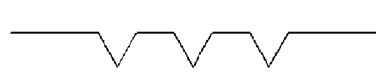
(b)
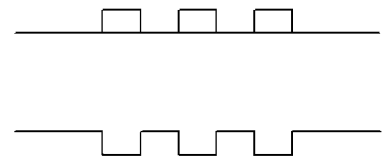
(c)
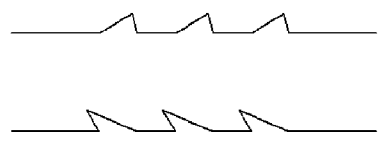
(d)
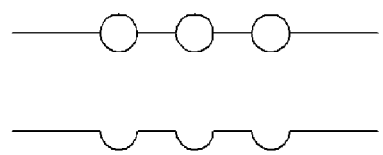

DEBRIS-FLOW SIMULATION APPARATUS HAVING VARIABLE FLUME

BACKGROUND OF THE INVENTION

1. Field of the Invention

The present invention relates generally to debris-flow simulation apparatuses having variable flumes and, more particularly, to a debris-flow simulation apparatus in which the angle of inclination, width and length of a flume can be adjusted, and which can simulate multiple simultaneous debris-flows.

2. Description of the Related Art

The cause of most landslides is the regional torrential rains of the summer season. In a landslide, thin soil layers slide down on top of basement rock. Particularly, in the case where the ground is unstable, debris-flow is easily caused.

Such debris-flow contains a large amount of soil mixed with boulders and moves a great distance at a comparatively high speed in a sliding manner. To understand the characteristics of debris-flow, small scale indoor flume tests have been used to conduct experiments on the engineering properties of debris-flow, for example, experiments that measure the flow rate and flow distance of fluid depending on the water content of fluid, or measure the mobility of fluid depending on the constituents of a fluid, that is, the constituents of soil.

FIG. 1 is a view showing the construction of a landslide simulation apparatus according to a conventional technique.

As shown in FIG. 1, the landslide simulation apparatus that was proposed in Korean Patent Application No. 10-2008-0066805 includes a sample discharge unit, a landslide channel unit and a spread observation unit. The sample discharge unit is disposed at an upper position and contains a sample having a predetermined water content which is later discharged when necessary. The landslide channel unit is provided under the sample discharge unit and inclined at a predetermined inclination angle such that it is taller at an inlet end and the height becomes smaller in the direction of an outlet end, so that the sample that has been discharged slides down along the landslide channel unit. The spread observation unit is horizontally provided such that it is connected to the outlet of the landslide channel unit. The sample that has slid down spreads along the upper surface of the spread observation unit. Thus, the possibility of a landslide and the range and extent of damage attributable to the landslide can be measured using the landslide simulation apparatus.

However, in the conventional technique, flow analysis is conducted using peripheral conditions while the angle of inclination, width and length of the flume are limited. Hence, there are limits and restrictions on evaluation of the flow of debris-flow. Furthermore, although the conventional technique can simulate specific debris-flow conditions using a single flume, it cannot precisely and reliably simulate different conditions of multiple simultaneous debris-flows.

SUMMARY OF THE INVENTION

Accordingly, the present invention has been made keeping in mind the above problems occurring in the prior art, and an object of the present invention is to provide a debris-flow simulation apparatus in which the angle of inclination, width and length of a flume can be adjusted so that the entire process including sliding, a debris avalanche and debris flow, caused after a slope failure, can be simulated, and the characteristics of debris-flow for different types of landslides can be simulated.

Another object of the present invention is to provide a debris-flow simulation apparatus which may be provided with a plurality of flumes so that multiple simultaneous debris-flows can be simulated, and in which the surface shape of each flume may be different.

In order to accomplish the above objects, the present invention provides a debris-flow simulation apparatus, including a flume comprising a plurality of flume bodies connected to each other in a longitudinal direction, wherein heights of the flume bodies are able to be adjusted so that angles of inclination of the flume bodies are variable.

A width of the flume may be variable.

A length of the flume may be variable.

The flume bodies of the flume may include: an upper flume body, an angle of inclination and a width of which are variable; a medial flume body connected to the upper flume body, the medial flume body being variable in an angle of inclination, a width and a length; and a lower flume body connected to the medial flume body, the lower flume body being variable in a width and a length.

The debris-flow simulation apparatus may further include a lift unit vertically lifting a connector between the upper flume body and the medial flume body, thus varying the angles of inclination of the upper flume body and the medial flume body.

The angle of inclination of the upper flume body may vary in such a way that a rail wheel provided on one end of the upper flume body vertically moves along a guide rail.

A water-pressure gauge or a load cell may be provided under a bottom of each of the upper flume body, the medial flume body and the lower flume body. The water-pressure gauge measures a water pressure, and the load cell measures a load of debris-flow.

Each of the upper flume body, the medial flume body and the lower flume body may include: a first side part comprising a first bottom surface, and a first sidewall vertically connected to the first bottom surface; and a second side part comprising a second bottom surface, and a second sidewall vertically connected to the second bottom surface, wherein when the second bottom surface is put into contact with the first sidewall and is placed on the first bottom surface, the width of the flume body is a minimum width, as the second bottom surface moves on the first bottom surface in a direction away from the first sidewall, the width of the flume body increases, and when the second bottom surface is put into contact with the first bottom surface and is level with the first bottom surface, the width of the flume body is a maximum width.

Each of the upper flume body, the medial flume body and the lower flume body may include: a medial part having a slide slot; a left side part provided on a left side of the medial part, the left side part comprising a left bottom surface sliding in the slide slot, and a left sidewall vertically connected to the left bottom surface; and a right side part provided on a right side of the medial part, the right side part comprising a right bottom surface sliding in the slide slot, and a right sidewall vertically connected to the right bottom surface, wherein when the left sidewall and the right sidewall are put into contact with the medial part, the width of the flume body is a minimum width, as the left bottom surface moves in the slide slot leftwards and the right bottom surface moves in the slide slot rightwards, the width of the flume body increases, and when the left bottom surface is moved to a left end of the slide slot and is fixed thereto and the right bottom surface is moved to a right end of the slide slot and is fixed thereto, the width of the flume body is a maximum width.

Each of the medial flume body and the lower flume body may include a multi-step slide member which is able to vary a length in a telescopic manner.

The flume may comprise a plurality of flumes arranged at positions spaced apart from each other at regular intervals or parallel to each other.

The flumes may respectively include gates provided at different positions in the flumes, each of the gates controlling discharge of debris-flow.

Each of the flumes may include a rough surface member removably attached thereto so that the rough surface member changes a surface roughness of the flume.

The rough surface member comprises sandpaper.

A cross-section of a surface of the rough surface member may be a wedge shape, a rectangular concave-convex shape, or a shape of triangles or bubbles.

In a debris-flow simulation apparatus having a variable flume according to the present invention, the angle of inclination, width and length of the flume can be easily adjusted so that the characteristics of different types of debris-flows can be investigated.

Furthermore, the present invention can simulate multiple simultaneous debris-flows using a plurality of flumes. Moreover, the amount of debris-flow in each flume can be individually adjusted by changing the position of a gate so that the flow rate of debris-flow relative to a predetermined amount of debris-flow and the distance that the debris-flow moves can be adjusted. The present invention can also provide a variety of topographic conditions wherein the roughness of the surfaces can be made different so that the state of debris-flow under specific topographic conditions can be simulated.

BRIEF DESCRIPTION OF THE DRAWINGS

The above and other objects, features and advantages of the present invention will be more clearly understood from the following detailed description taken in conjunction with the accompanying drawings, in which:

FIG. 2 is a side view of a debris-flow simulation apparatus having a variable flume, according to the present invention;

FIG. 4 is of views showing a variety of shapes of an upper flume body, a medial flume body and a lower flume body of the flume of the debris-flow simulation apparatus according to the present invention;

FIG. 5 is of views showing the operation of varying the angles of inclination of the upper flume body and the medial flume body of the debris-flow simulation apparatus according to the present invention;

FIG. 7 is of views showing a second example of the operation of varying the width of the upper, medial or lower flume body of the debris-flow simulation apparatus according to the present invention;

FIG. 8 is of views showing different length ratios of the upper, medial and lower flume bodies of the debris-flow simulation apparatus according to the present invention;

FIG. 12 is views showing a variety of shapes of a rough surface member used in the debris-flow simulation apparatus according to the present invention.

DESCRIPTION OF THE PREFERRED EMBODIMENTS

Figure 1:
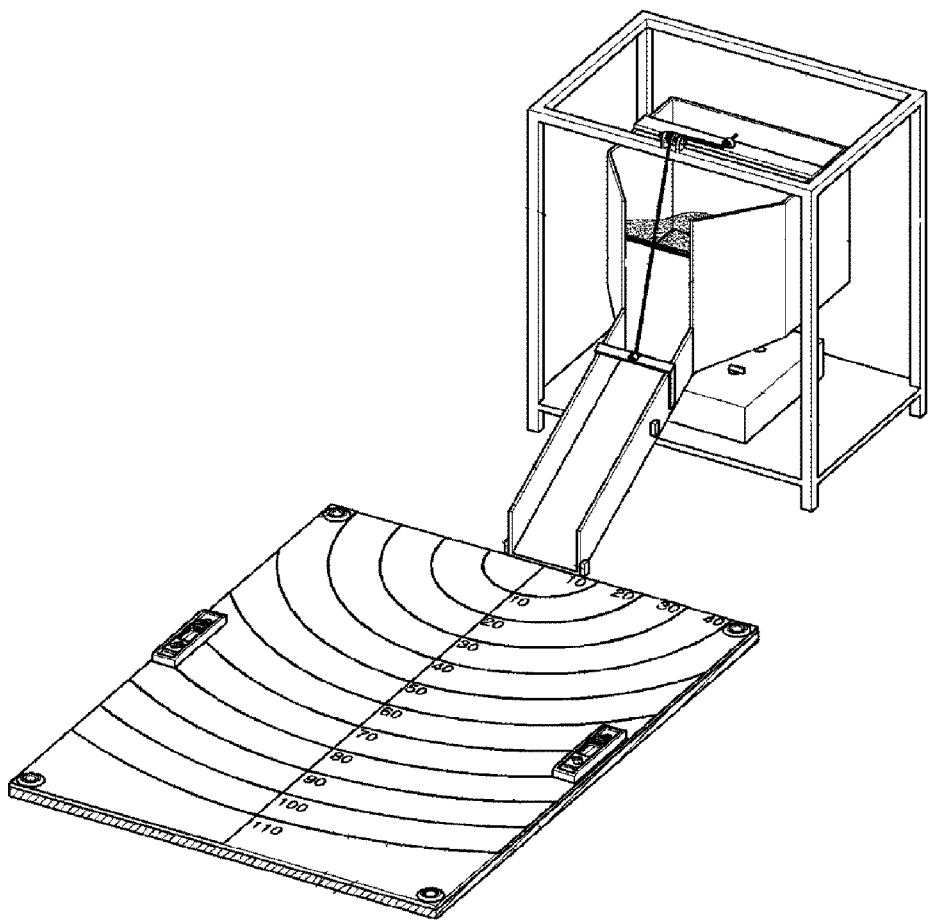
FIG. 1 is a view showing the construction of a landslide simulation apparatus according to a conventional technique.

Hereinafter, a preferred embodiment of the present invention will be described in detail with reference to the attached drawings. Reference now should be made to the drawings, in which the same reference numerals are used throughout the different drawings to designate the same or similar components. If in the specification, detailed descriptions of well-known functions or configurations would unnecessarily obfuscate the gist of the present invention, the detailed descriptions will be omitted.

A debris-flow simulation apparatus according to the present invention includes a flume. The flume includes a plurality of flume bodies which are connected to each other in the longitudinal direction. Especially, in the present invention, the heights of the flume bodies can be adjusted, thus varying the angles of inclination of the flume bodies.

Although the debris-flow simulation apparatus which is embodied by three flume bodies that are connected to each other in the longitudinal direction will now be described in detail, the number of flume bodies used to embody the present invention is not limited to three, that is, it can adopt different values.

Figure 3A:
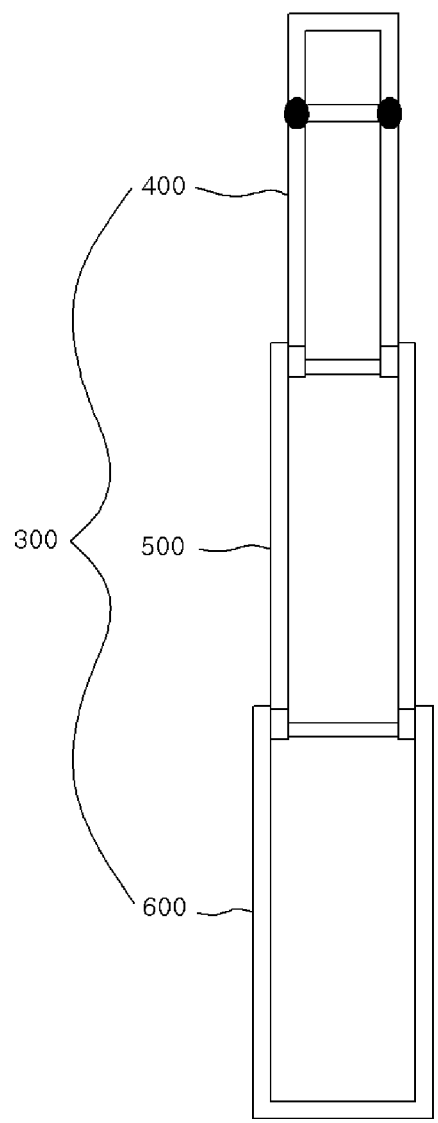
FIG. 3a is a first plan view of the debris-flow simulation apparatus according to the present invention.
Figure 3B:
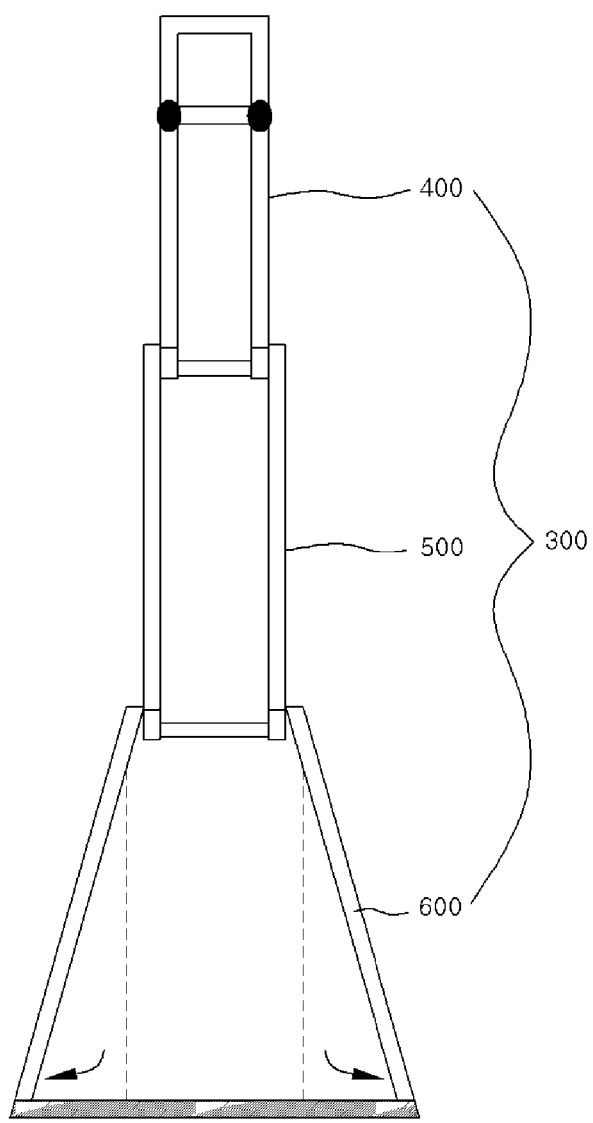
FIG. 3b is a second plan view of the debris-flow simulation apparatus according to the present invention.

FIG. 2 is a side view of the debris-flow simulation apparatus according to the present invention. FIG. 3a is a first plan view of the debris-flow simulation apparatus according to the present invention. FIG. 3b is a second plan view of the debris-flow simulation apparatus according to the present invention.

As shown in FIGS. 2 and 3a, the debris-flow simulation apparatus according to the present invention includes a horizontal frame 100, a vertical frame 200 and a flume 300. The flume 300 includes an upper flume body 400, a medial flume body 500 and a lower flume body 600.

The horizontal frame 100 is disposed under the flume 300 and supports the flume 300.

The vertical frame 200 is connected at a right angle to the horizontal frame 100 and disposed at a side of the flume 300 to support the flume 300. Preferably, the vertical frame 200 is connected to one end of the flume 300, thus supporting the end of the flume 300.

The upper flume body 400 is installed on the horizontal frame 100. A first end of the upper flume body 400 is connected to the vertical frame 200 so as to be slidable along the vertical frame 200. Thus, the angle of inclination of the upper flume body 400 can be changed by sliding the upper flume body 400 along the vertical frame 200.

For instance, a rail wheel (not shown) may be provided on the first end of the upper flume body 400 that is connected to the vertical frame 200, and a guide rail (not shown) that corresponds to the rail wheel may be provided on the vertical frame 200. In this case, the angle of inclination of the upper flume body 400 can be changed in such a way that the rail wheel slides along the guide rail upwards or downwards and is fixed at a predetermined position.

Preferably, the angle ($\alpha$) of inclination of the upper flume body 400 ranges from 0° to 50°. The reason for using such a wide range in experiments compared to the range of from 25° to 35° within which an actual landslide occurs is to take the safety factor into account.

FIG. 4 is a view showing a variety of shapes of the upper flume body, the medial flume body and the lower flume body of the debris-flow simulation apparatus according to the present invention.

As shown in FIG. 4, the cross-section of the upper flume body 400 may be a rectangular shape (a), a semicircular shape (b), an inverted triangular shape (c) or a semi-hexagonal shape (d). Particularly, as shown in FIG. 4(e), a variety of landforms can be simulated in such a way that removable members 950 are disposed in the upper flume body 400, for example, removable members 950 are disposed in the upper flume body 400 having the rectangular shape (a) to form a semi-pentagonal shape (e). As shown in FIG. 2, a water-pressure gauge 800 and a load cell 900 are provided under the bottom of the upper flume body 400 to measure the water pressure in the upper flume body 400 and the load of the debris-flow that flows through the upper flume body 400.

The medial flume body 500 is installed on the horizontal frame 100, and a first end of the medial flume body 500 is connected to a second end of the upper flume body 400 by a connector 700. The angles of inclination of the upper and medial flume bodies 400 and 500 can be adjusted by vertically moving the connector 700. In the same manner as the upper flume body 400, as shown in FIG. 4, the cross-section of the medial flume body 500 may also be a rectangular shape (a), a semicircular shape (b), an inverted triangular shape (c), a semi-hexagonal shape (d) or a semi-pentagonal shape (e). As shown in FIG. 2, a water-pressure gauge 800 and a load cell 900 are provided under the bottom of the medial flume body 500 to measure the water pressure in the medial flume body 500 and the load of the debris-flow that flows through the medial flume body 500.

The connector 700 is disposed on the horizontal frame 100. A lift unit 110 is provided on the horizontal frame 100 at a predetermined position corresponding to the connector 700 so that the lift unit no vertically lifts the connector 700, thus adjusting the angles of inclination of the upper and medial flume bodies 400 and 500. For example, the lift unit no may comprise a hydraulic cylinder.

FIG. 5 is of views showing the operation of varying the angles of inclination of the upper flume body and the medial flume body of the debris-flow simulation apparatus according to the present invention.

As shown in FIG. 5, the angle of inclination of the upper flume body 400 can vary in such a way that the first end of the upper flume body 400 vertically slides along the vertical frame 200, or the lift unit no vertically moves the connector 700. When the lift unit no vertically moves the connector 700, the angle of inclination of the medial flume body 500 can also vary.

The lower flume body 600 is installed on the horizontal frame 100, and a first end of the lower flume body 600 is connected to a second end of the medial flume body 500 by a connector 710. A second end of the lower flume body 600 and the connector 710 that connects the medial flume body 500 to the lower flume body 600 are disposed on the upper surface of the horizontal frame 100. In the same manner as the upper flume body 400 and the medial flume body 500, as shown in FIG. 4, the cross-section of the lower flume body 600 may also be a rectangular shape (a), a semicircular shape (b), an inverted triangular shape (c), a semi-hexagonal shape (d) or a semi-pentagonal shape (e). As shown in FIG. 2, a water-pressure gauge 800 and a load cell 900 are provided under the bottom of the lower flume body 600 to measure the water pressure in the lower flume body 600 and the load of debris-flow that flows through the lower flume body 600. Particularly, as shown in FIG. 3b, the lower flume body 600 may be configured such that the width of the rectangular lower flume body of FIG. 3a is increased from the first end thereof to a second end, thus forming a shape similar to that of a fan.

The debris-flow simulation apparatus according to the present invention can not only vary the angle of inclination of the flume, as stated above, but can also vary the width of the flume.

The width of all of the upper flume body 400, the medial flume body 500 and the lower flume body 600 can be adjusted. Because the methods of varying the width of the medial flume body 500 and the lower flume body 600 are the same as that used by the upper flume body 400, only the method of varying the width of the upper flume body 400 will be described below.

Figure 6:
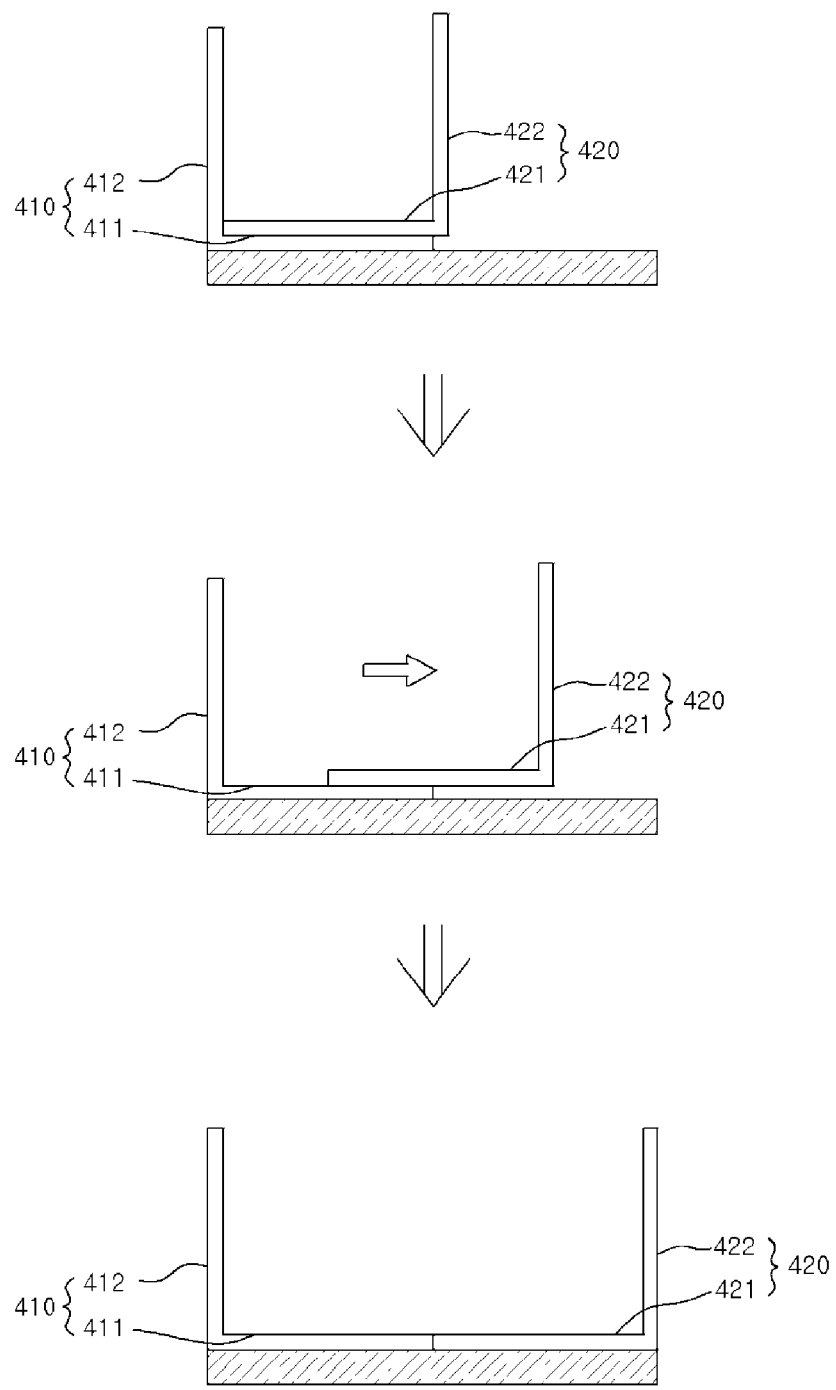
FIG. 6 is of views showing a first example of the operation of varying the width of the upper, medial or lower flume body of the debris-flow simulation apparatus according to the present invention.

FIG. 6 is of views showing a first example of the operation of varying the width of the upper, medial or lower flume body of the debris-flow simulation apparatus according to the present invention.

As shown in FIG. 6, to embody the structure capable of varying the width, for example, the upper flume body 400 includes a first side part 410 and a second side part 420. The first side part 410 includes a first bottom surface 411 and a first sidewall 412 which is vertically connected to the first bottom surface 411. The second side part 420 includes a second bottom surface 421 and a second sidewall 422 which is vertically connected to the second bottom surface 421.

In detail, the width of the upper flume body 400 is the minimum width when the second bottom surface 421 is put into contact with the first sidewall 412 and is placed on the first bottom surface 411. As the second bottom surface 421 slides on the first bottom surface 411 in a direction away from the first sidewall 412, the width of the upper flume body 400 can be increased. When the second bottom surface 421 is level with the first bottom surface 411 and makes contact with the first bottom surface 411, the width of the upper flume body 400 is the maximum width.

FIG. 7 is of views showing a second example of the operation of varying the width of the upper, medial or lower flume body of the debris-flow simulation apparatus according to the present invention.

As shown in FIG. 7, to embody the structure capable of varying the width, for example, the upper flume body 400 includes a medial part 430, a left side part 440 which is provided on a left side of the medial part 430, a right side part 450 which is provided on a right side of the medial part 430. A slide slot 431 is formed in the medial part 430. The left side part 440 includes a left bottom surface 441 which slides in the slide slot 431, and a left sidewall 442 which is vertically connected to the left bottom surface 441. The right side part 450 includes a right bottom surface 451 which slides in the slide slot 431, and a right sidewall 452 which is vertically connected to the right bottom surface 451.

When the left sidewall 442 and the right sidewall 452 are put into contact with the medial part 430, the width of the upper flume body 400 is the minimum width. As the left bottom surface 441 slides in the slide slot 431 to the left and the right bottom surface 451 slides in the slide slot 431 to the right, the width of the upper flume body 400 is increased.

When the left bottom surface 441 has moved to the left end of the slide slot 431 and is fixed thereto and the right bottom surface 451 has moved to the right end of the slide slot 431 and is fixed thereto, the width of the upper flume body 400 is the maximum width.

To slide the left side part 440 and the right side part 450 in the slide slot 431, a rail wheel (not shown) may be included in each of the left and right bottom surfaces 441 and 451, while the slide slot 431 may include a guide rail (not shown) that corresponds to the rail wheels. The rail wheels are fixed at predetermined positions and slide along the guide rail to the left and right in such a way that the width of the upper flume body 400 can vary.

In the debris-flow simulation apparatus according to the present invention, as stated above, not only can the angle of inclination and the width of the flume be changed, but the length of the flume can also be changed.

In detail, the length of each of the medial flume body 500 and the lower flume body 600 can be varied. For instance, to vary the length, each of the medial and lower flume bodies 500 and 600 may comprise a multi-step slide member which can vary the length in a telescopic manner.

FIG. 8 is of views showing different length ratios of the upper, medial and lower flume bodies of the debris-flow simulation apparatus according to the present invention.

As shown in FIG. 8, the lengths of the medial flume body 500 and the lower flume body 600 can be varied so that the length ratio among the upper, medial and lower flume bodies 400, 500 and 600 can be adjusted to a variety of ratios, for example, (a) 1:1:1, (b) 1:2:3 or (c) 1:2:5.

In case (a) where the length ratio among the upper flume body 400, the medial flume body 500 and the lower flume body 600 is 1:1:1, the entire length of the debris-flow simulation apparatus is within 10 m which is appropriate for conducting an experiment on the behavior of a debris slide. In case (b) where the length ratio is 1:2:3, the entire length of the debris-flow simulation apparatus is within 100 m which is appropriate for conducting an experiment on the behavior of a debris avalanche. In case (c) where the length ratio is 1:2:5, the entire length of the debris-flow simulation apparatus ranges from 1 km to 10 km which is appropriate for conducting an experiment on the behavior of debris flow.

As shown in FIG. 2, the debris-flow simulation apparatus according to the present invention may further include a plurality of spray nozzles 910 which spray water onto the upper flume body 400, the medial flume body 500 and the lower flume body 600 to simulate raining conditions.

The debris-flow simulation apparatus according to the present invention may include a plurality of flumes which are arranged in parallel at positions adjacent to each other or spaced apart from each other at regular intervals. Each flume can be embodied by a plurality of flume bodies which are connected to each other in the longitudinal direction, as described above.

Hereinafter, although the debris-flow simulation apparatus in which the flumes are arranged in parallel at positions adjacent to each other will be explained in detail, the present invention may also be configured such that the flumes are spaced apart from each other at regular intervals.

Figure 9:
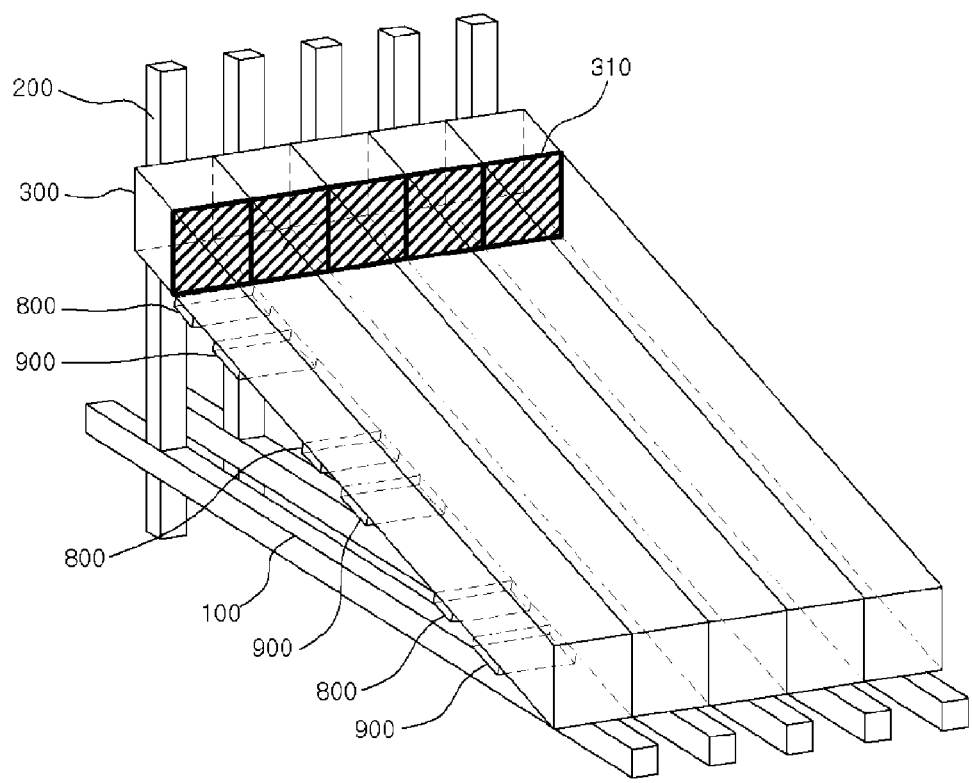
FIG. 9 is a view illustrating a first example of the construction of the debris-flow simulation apparatus in which a plurality of flumes are arranged, according to the present invention.

FIG. 9 is a view illustrating a first example of the construction of the debris-flow simulation apparatus in which a plurality of flumes are arranged, according to the present invention.

As shown in FIG. 9, the debris-flow simulation apparatus according to the present invention includes a plurality of horizontal frames 100, a plurality of vertical frames 200 and a plurality of flumes 300.

The horizontal frames 100 are disposed under the respective flumes 300 to support the corresponding flumes 300, as stated above.

Each vertical frame 200 is perpendicularly connected to the corresponding horizontal frame 100 and is disposed at a side of the corresponding flume 300 to support the flume 300. Preferably, each vertical frame 200 is connected to one end of the corresponding flume 300, so that the end of the flume 300 is supported.

Each flume 300 is connected at one end thereof to the corresponding vertical frame 200 and placed on the corresponding horizontal frame 100 at a predetermined inclination angle. The opposite sidewalls of the flumes 300 are connected one after another such that the flumes 300 are inclined on the horizontal frames 100 at the same angle, thus forming the flow channels that can simulate multiple simultaneous debris-flows.

Furthermore, a gate 310 may be provided in each flume 300 to control the discharge of debris-flow. In an embodiment, the gates 310 may be disposed at different positions in the flumes 300.

Figure 10:
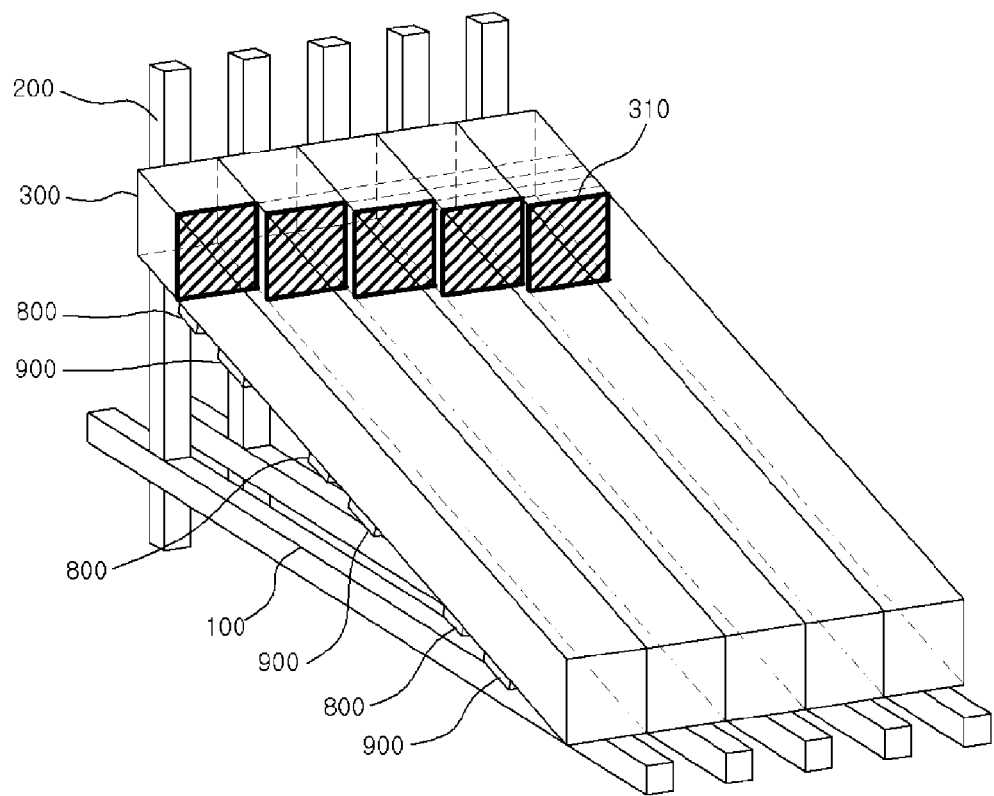
FIG. 10 is a view illustrating a second example of the construction of the debris-flow simulation apparatus in which a plurality of flumes are arranged, according to the present invention.

FIG. 10 is a view illustrating a second example of the construction of the debris-flow simulation apparatus in which a plurality of flumes are arranged, according to the present invention.

In detail, as shown in FIG. 10, the gates 310 can be installed in the respective flumes 300 at different positions, so that the amount of debris-flow that is drawn into each flume 300 can be adjusted. As such, the amount of debris-flow that is drawn into each flume 300 can be individually controlled by adjusting the installation position of the corresponding gate 310. Hence, the flow rate of debris-flow depending on the amount of debris-flow and the distance that the debris-flow moves can be measured.

Figure 11:
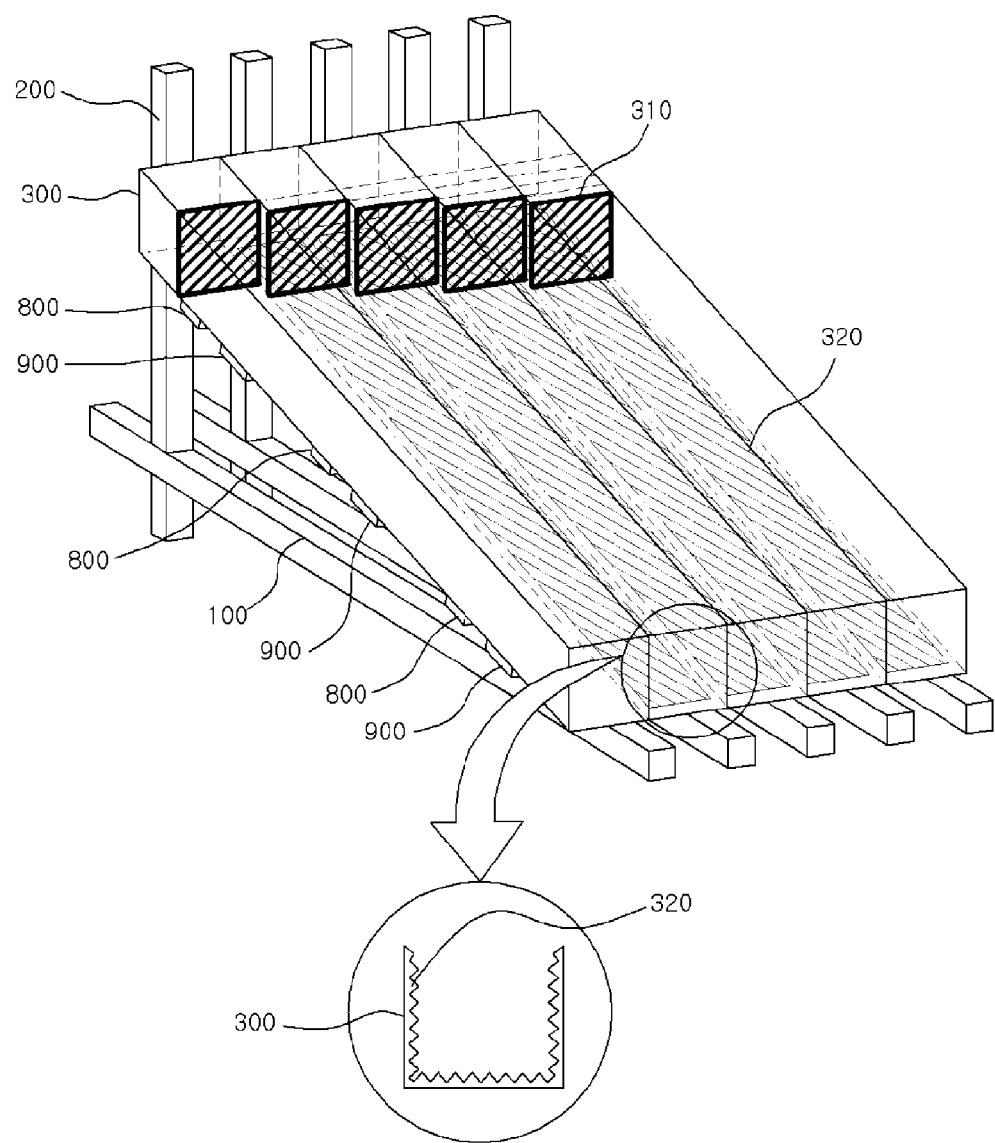
FIG. 11 is a view illustrating a third example of the construction of the debris-flow simulation apparatus in which a plurality of flumes are arranged, according to the present invention.

FIG. 11 is a view illustrating a third example of the construction of the debris-flow simulation apparatus in which a plurality of flumes are arranged, according to the present invention.

As shown in FIG. 11, a rough surface member 320 may be removably provided in the flume 300 to change the surface roughness of the flume 300.

FIG. 12 is views showing a variety of shapes of the rough surface member used in the debris-flow simulation apparatus according to the present invention.

The rough surface member 320 may comprise sandpaper. As shown in FIG. 12, the cross-section of the rough surface member 320 may adopt a wedge shape (a), a rectangular concave-convex shape (b), or the shape of triangles (c) or bubbles (d), thus providing different levels of surface roughness. As such, different kinds of rough surface members 320 which simulate a variety of topographic conditions can be removably attached on the inner surface of the flume 300 so that debris-flow corresponding to specific topographic conditions can be simulated.

As shown in FIG. 11, the rough surface member 320 may be attached to all of the bottom and side surfaces of the flume 300 to create predetermined surface roughness conditions. Furthermore, some of the flumes 300, for example, the first flume 300, may be provided without the rough surface member 320 so as to compare conditions of debris-flow depending on whether there is a rough surface member 320 or not.

As described above, in the present invention, the angle of inclination, width and length of a flume can be easily adjusted so that characteristics of different types of debris-flows can be investigated. For instance, if the flume is comparatively wide and short, characteristics of the behavior of a slide or debris avalanche can be investigated. If the flume is comparatively narrow and long, characteristics of the behavior of debris-flow can be investigated.

Furthermore, the present invention can simulate multiple simultaneous debris-flows using a plurality of flumes. Moreover, the amount of debris-flow in each flume can be individually adjusted by changing the position of a gate so that the flow rate of debris-flow depending on a predetermined amount of debris-flow and the distance that debris-flow moves can be adjusted. The present invention can provide a variety of topographic conditions having different surface roughnesses so that a state of debris-flow under specific topographic conditions can be simulated.

Although the embodiments of the debris-flow simulation apparatus according to the present invention have been disclosed with reference to the drawings, those skilled in the art will appreciate that various modifications, additions and substitutions are possible, without departing from the scope and spirit of the invention as disclosed in the accompanying claims.

What is claimed is:

1. A debris-flow simulation apparatus, comprising:
  a flume comprising a plurality of flume bodies connected to each other in a longitudinal direction,
  wherein heights of the flume bodies are able to be adjusted so that angles of inclination of the flume bodies are variable,
  wherein length of the flume is variable,
  wherein the flume bodies of the flume comprise:
    an upper flume body, an angle of inclination and a width of which are variable;
    a medial flume body connected to the upper flume body, the medial flume body being variable in an angle of inclination, a width and a length; and
    a lower flume body connected to the medial flume body, the lower flume body being variable in a width and a length,
  wherein each of the upper flume body, the medial flume body and the lower flume body comprises:
    a first side part comprising a first bottom surface, and a first sidewall vertically connected to the first bottom surface; and
    a second side part comprising a second bottom surface, and a second sidewall vertically connected to the second bottom surface,
    wherein when the second bottom surface is put into contact with the first sidewall and is placed on the first bottom surface, the width of the flume body is a minimum width,
    as the second bottom surface moves on the first bottom surface in a direction away from the first sidewall, the width of the flume body increases, and
    when the second bottom surface is put into contact with the first bottom surface and is level with the first bottom surface, the width of the flume body is a maximum width.

2. A debris-flow simulation apparatus, comprising:
  a flume comprising a plurality of flume bodies connected to each other in a longitudinal direction,
  wherein heights of the flume bodies are able to be adjusted so that angles of inclination of the flume bodies are variable,
  wherein length of the flume is variable,
  wherein the flume bodies of the flume comprise:
    an upper flume body, an angle of inclination and a width of which are variable;
    a medial flume body connected to the upper flume body, the medial flume body being variable in an angle of inclination, a width and a length; and
    a lower flume body connected to the medial flume body, the lower flume body being variable in a width and a length,
  wherein each of the upper flume body, the medial flume body and the lower flume body comprises:
    a medial part having a slide slot;
    a left side part provided on a left side of the medial part, the left side part comprising a left bottom surface sliding in the slide slot, and a left sidewall vertically connected to the left bottom surface; and
    a right side part provided on a right side of the medial part, the right side part comprising a right bottom surface sliding in the slide slot, and a right sidewall vertically connected to the right bottom surface,
    wherein when the left sidewall and the right sidewall are put into contact with the medial part, the width of the flume body is a minimum width,
    as the left bottom surface moves in the slide slot leftwards and the right bottom surface moves in the slide slot rightwards, the width of the flume body increases, and
    when the left bottom surface is moved to a left end of the slide slot and is fixed thereto and the right bottom surface is moved to a right end of the slide slot and is fixed thereto, the width of the flume body is a maximum width.

3. The debris-flow simulation apparatus as set forth in claim 1 or 2, wherein a width of the flume is variable.

4. The debris-flow simulation apparatus as set forth in claim 1 or 2, further comprising
  a lift unit vertically lifting a connector between the upper flume body and the medial flume body, thus varying the angles of inclination of the upper flume body and the medial flume body.

5. The debris-flow simulation apparatus as set forth in claim 1 or 2, wherein a water-pressure gauge or a load cell is provided under a bottom of each of the upper flume body, the medial flume body and the lower flume body, and the water-pressure gauges measuring a water pressure, the load cells measuring a load of debris-flow.

6. The debris-flow simulation apparatus as set forth in claim 1 or 2, wherein each of the medial flume body and the lower flume body comprises a multi-step slide member which is able to vary a length in a telescopic manner.

7. The debris-flow simulation apparatus as set forth in claim 1 or 2, wherein the flume comprises a plurality of flumes arranged at positions spaced apart from each other at regular intervals or parallel to each other.

8. The debris-flow simulation apparatus as set forth in claim 7, wherein the plurality of flumes respectively comprise gates provided at different positions in the flumes, each of the gates controlling discharge of debris-flow.

* * * * *